(12) United States Patent
Joung et al.

(10) Patent No.: US 7,151,368 B2
(45) Date of Patent: Dec. 19, 2006

(54) INSERT BLOCK WITH PUSHER TO PUSH SEMICONDUCTOR DEVICE UNDER TEST

(75) Inventors: Hyeck-Jin Joung, Chungcheongnam-do (KR); Heui-Seog Kim, Chungcheongnam-do (KR); Seok-Young Yoon, Chungcheongnam-do (KR); Jong-Keun Jeon, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/243,458

(22) Filed: Oct. 3, 2005

(65) Prior Publication Data

US 2006/0071656 A1    Apr. 6, 2006

(30) Foreign Application Priority Data

Oct. 1, 2004    (KR)    ...... 10-2004-0078247

(51) Int. Cl.
*H01R 13/62* (2006.01)
*H01R 13/15* (2006.01)

(52) U.S. Cl. ............ 324/158.1; 439/259; 439/296

(58) Field of Classification Search ............... None
See application file for complete search history.

(56) References Cited

U.S. PATENT DOCUMENTS

| | | | | |
|---|---|---|---|---|
| 3,466,514 | A * | 9/1969 | Brunner et al. | 318/577 |
| 5,017,056 | A * | 5/1991 | Morash | 408/1 R |
| 6,043,667 | A * | 3/2000 | Cadwallader et al. | 324/758 |
| 6,128,074 | A * | 10/2000 | Hong et al. | 356/237.1 |
| 6,425,178 | B1 * | 7/2002 | Lee et al. | 29/759 |
| 6,446,951 | B1 * | 9/2002 | Nuxoll et al. | 269/118 |
| 6,802,728 | B1 * | 10/2004 | Howell et al. | 439/160 |

FOREIGN PATENT DOCUMENTS

| | | |
|---|---|---|
| KR | 11-287842 | 10/1999 |
| KR | 2002-61879 | 7/2002 |
| KR | 2003-59992 | 7/2003 |
| KR | 2004-0029563 | 4/2004 |

OTHER PUBLICATIONS

English language abstract of Korean Publication No. 2002-61879, 2002.
English language abstract of Korean Publication No. 2003-59992, 2003.
English language abstract of Japanese Publication No. 11-287842, 1999.

* cited by examiner

*Primary Examiner*—Paresh Patel
(74) *Attorney, Agent, or Firm*—Marger Johnson & McCollom, P.C.

(57) ABSTRACT

The present invention relates to an insert block for testing semiconductor devices. The insert block comprises one or more pushers, installed in a block body having a loading space to accommodate a semiconductor device under test, including a first push rod to apply force to one of adjacent sides of the semiconductor device under test and a second push rod to apply force to the other thereof.

Accordingly, firm centering of semiconductor devices under test relative to the contact pins of the test socket along the two perpendicular axes (for instance, x and y axes) on the top or bottom surface of the semiconductor device is achieved and leads to the proper interfaces between the external terminals of the semiconductor device under test and the contact pins of the test socket, and thereby improves the quality of connection therebetween.

15 Claims, 7 Drawing Sheets

US 7,151,368 B2

INSERT BLOCK WITH PUSHER TO PUSH SEMICONDUCTOR DEVICE UNDER TEST

CROSS REFERENCE TO RELATED APPLICATIONS

This U.S. non-provisional application claims priority and benefit of Korean Patent Application No. 2004-78247, filed on Oct. 1, 2004, the entire contents of which are incorporated herein by reference.

BACKGROUND OF THE INVENTION

1. Field of the Invention

The present invention relates to an insert block for loading semiconductor devices under test and, more particularly, to an insert block for testing semiconductor devices that transports, fixes, and centers them under test.

2. Description of the Related Art

After wafer processing, semiconductor chips cut from the wafer are assembled into semiconductor packages. Test processes are carried out to verify not only the electric characteristics but also the reliability, including functionality, of the semiconductor packages. An apparatus, usually a handler, is used to test fabricated semiconductor packages and sort tested packages.

A handler for testing semiconductor packages can generally be classified as a vertical handler and a horizontal handler. The vertical handler receives semiconductor packages sequentially, tests them, and sorts them according to their test results. The horizontal handler uses multiple trays, and each tray is loaded with multiple semiconductor packages. Tests are performed when the trays are loaded with semiconductor packages. Being moved from the tested tray to a new tray, tested packages are sorted into bins according to their test results.

The horizontal handler includes a loading area, supply area, test area, and sorting area. In the loading area, insert blocks of an insert tray are loaded with multiple untested semiconductor packages by picking them from a receiving tray loaded with untested packages prior to testing. In the supply area, insert trays loaded with untested packages are transported to the test area. In the test area, testing on the semiconductor packages contained in the insert blocks of the insert tray is performed. In the sorting area, tested semiconductor packages from the insert trays are sorted according to their test results and the sorted packages are loaded into a new receiving tray. After sorting, the insert trays are transported back to the loading area, and these semiconductor package test processes are repeated.

In other words, in semiconductor package test processes using horizontal handlers, multiple insert blocks are arranged horizontally in an insert tray, and each insert block is loaded with multiple semiconductor packages under test.

FIG. 1 is a schematic perspective view showing an insert tray of a conventional horizontal handler.

Referring to FIG. 1, multiple insert blocks 30 are arranged at a designated interval in a tray frame 20 of the insert tray 100. Insert blocks 30 are coupled with the tray frame 20 via coupling pins 101. The coupling pin 101 is inserted into a coupling hole 102 on the tray frame 20 and fixed. Devices under test (DUT) such as semiconductor packages are loaded in each insert block 30.

FIG. 2 is a sectional view showing the conventional insert block, taken along the x–z plane in FIG. 1, for testing semiconductor packages.

The same insert block for testing semiconductor packages as the one shown in FIG. 2 is already made public in 2002 via Korean Patent Publication No. 2002-61879 filed by Samsung Electronics Corporation.

As shown in FIG. 2, the insert block 30 includes a block body 31, a latch 32, and a latch cap 33.

The block body 31 includes a fixing hole 31a to fix the insert block 30 during testing, a loading space G1 to accommodate a semiconductor device under test (DUT, hereinafter), and a loading member 31b where the DUT is loaded.

Various types of DUTs can be loaded, and a BGA (ball grid array) package is shown here. A plurality of solder balls B1, which act as external terminals of the DUT, are provided on the bottom surface of the DUT, and these contact with corresponding contact pins C1 of a test socket (not shown).

FIG. 3 is a view showing in detail the P portion of FIG. 2. Hereinafter, the latch 32 and latch cap 33 are explained in detail with reference to FIG. 3.

The latch 32 turns in the M1 or M2 direction with its rotating shaft 32a as the axis of rotation. Turning in the M1 direction, the latch 32 applies force to the side and top surface of the DUT. A sliding groove 32b is formed in the latch 32, and a hanging bar 33a of the latch cap 33 is inserted therein.

The latch cap 33 moves up and down in the direction of the z-axis along a cap guide (31c in FIG. 2). The latch cap 33 includes the cylindrical-shaped hanging bar 33a, which is inserted into the sliding groove 32b of the latch 32. Consequently, the up and down movement of the latch cap 33 causes the latch 32 to rotate in the M1 or M2 direction via the cam-like behavior of the hanging bar 33a and sliding groove 32b.

As shown in FIG. 3, since the latch 32 applies pressure to the top surface of the DUT downward along the z-axis and to the side thereof toward the right along the x-axis, the DUT comes to be fixed relative to the z-axis and be aligned along the x-axis with respect to the contact pins of the test socket.

FIG. 4 is a cross-sectional view, taken along the y-z plane, showing the DUT loaded in the conventional insert block contacts with the contact pins of the test socket. However, as shown in FIG. 1, the latch 32 of the conventional insert block 30 for testing semiconductor devices aligns the DUT only with respect to the x-axis, and the DUT may float considerably along the y-axis. Given that the tolerances with respect to the x and y-axes of the DUT are in the range of about 0.1 to about 0.2 mm, there is a problem that, seen from the x-y plane, the DUT may not be centered relative to the contact pins of the test socket. Namely, as shown in FIG. 4, poor contact between the solder balls B1 and the contact pins C1 can be caused by the bad alignment therebetween with respect to the y-axis. Furthermore, the contact pins C1 exert pressure upward along the z-axis on the side N1 apart from the center of the solder balls B1, and this eccentric pressure can result in a critical problem by detaching the solder balls B1 from the DUT.

Accordingly, there is a need for an enhanced insert block for testing semiconductor devices which is capable of centering firmly semiconductor devices under test with respect to the contact pins of the test socket along the two perpendicular axes of the top or bottom surface of the semiconductor device.

SUMMARY OF THE INVENTION

An insert block for testing semiconductor devices according to the invention comprises a block body having a loading space to accommodate a semiconductor device under test, and one or more pushers installed in the block body so as to apply force to the semiconductor device under test, wherein the pusher includes a first push rod to apply force to one of adjacent sides of the semiconductor device under test, and a second push rod to apply force to the other thereof.

According to a preferred embodiment of the invention, a first contact surface of the first push rod contacting with the corresponding side of the semiconductor device under test is perpendicular to a second contact surface of the second push rod.

According to a preferred embodiment of the invention, the first and second push rods have hemispheric protrusions, and the hemispheric protrusions make point contact with the semiconductor device under test.

According to a preferred embodiment of the invention, the pushers are rotary pushers rotating around an axial shaft installed in the block body as the center of rotation.

According to a preferred embodiment of the invention, the insert block further comprises a sliding groove formed on the rotary pusher, and a reciprocating body having a hanging protrusion which is inserted into the sliding groove so as to reciprocate therein.

According to a preferred embodiment of the invention, the insert block further comprises a reciprocating body spring which is installed between the reciprocating body and the block body and pushes away the reciprocating body from the block body.

According to a preferred embodiment of the invention, there are two rotary pushers, and the first and second rotary pushers apply forces to the two diagonally opposite corners selected from the four corners of the semiconductor device under test.

According to a preferred embodiment of the invention, the block body comprises a stopper to contact with the rotary pusher so as to limit the degree of rotation thereof.

According to a preferred embodiment of the invention, the insert block further comprises a weight plate installed on the block body and contacting with the reciprocating body, and a weight plate spring placed between the weight plate and the block body so as to separate the weight plate from the block body.

According to a preferred embodiment of the invention, the sliding groove is linear, and the direction of movement of the reciprocating body makes a designated angle with the direction extended from the linear sliding groove.

According to a preferred embodiment of the invention, the first contact surface of the first push rod contacting with the semiconductor device under test is perpendicular to the second contact surface of the second push rod, and the angle between the direction extended from the intersecting line made by the extended surfaces from the first and second contact surfaces and the direction extended from the sliding groove is in the range of about 3 to about 45°.

According to a preferred embodiment of the invention, the insert block further comprises a pusher spring installed between the block body and the pusher so as to push the pusher toward the semiconductor device under test.

DETAILED DESCRIPTION OF EXEMPLARY EMBODIMENTS

Exemplary non-limiting embodiments of the invention will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 5:
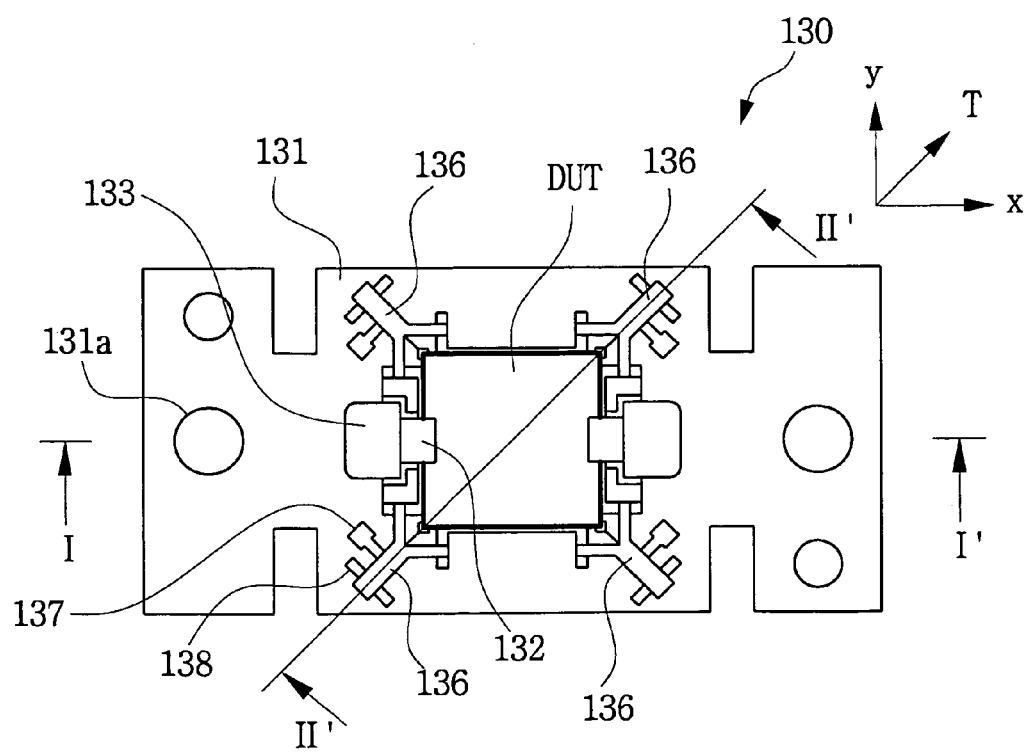
FIG. 5 is a top view showing an insert block for testing semiconductor devices according to the invention.
Figure 6:
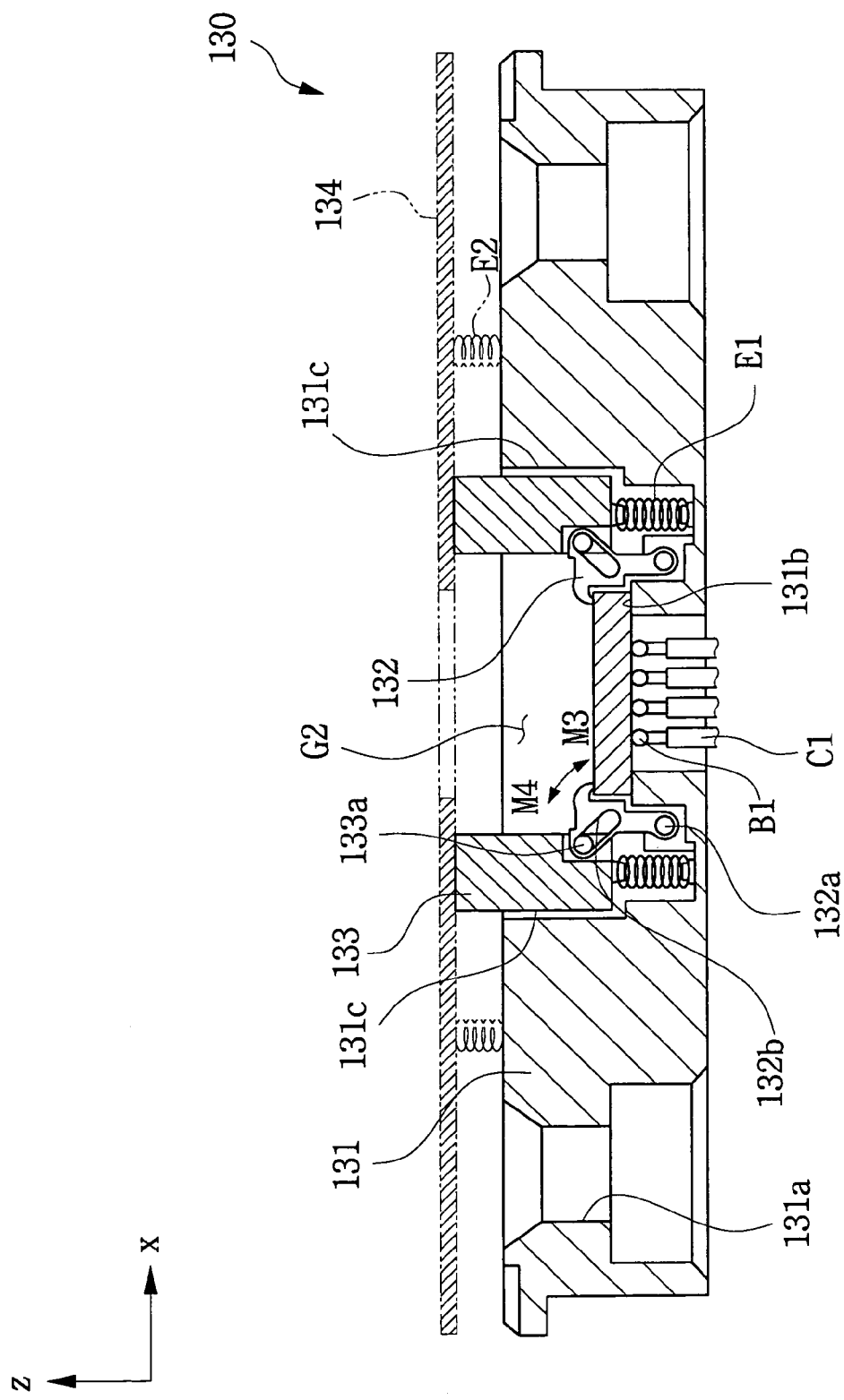
FIG. 6 is a sectional view taken along line I–I' in FIG. 5.

FIG. 5 is a top view showing an insert block for testing semiconductor devices according to the invention, and FIG. 6 is a cross-sectional view taken along line I–I' in FIG. 5.

As shown in FIGS. 5 and 6, the insert block 130 includes a block body 131, a latch 132, and a latch cap 133.

The block body 131 includes a fixing hole 131a to fix the insert block 130 during testing, a loading space G2 to accommodate a semiconductor device under test (DUT), and a loading member 131b on which the DUT is loaded.

Various types of semiconductor packages can be loaded of course as DUTs, although a BGA (ball grid array) package is shown as DUT in this embodiment. A plurality of solder balls B1, which act as external terminals, are provided on the bottom surface of the DUT, and these contact with corresponding contact pins C1 of a test socket (not shown).

Figure 1:
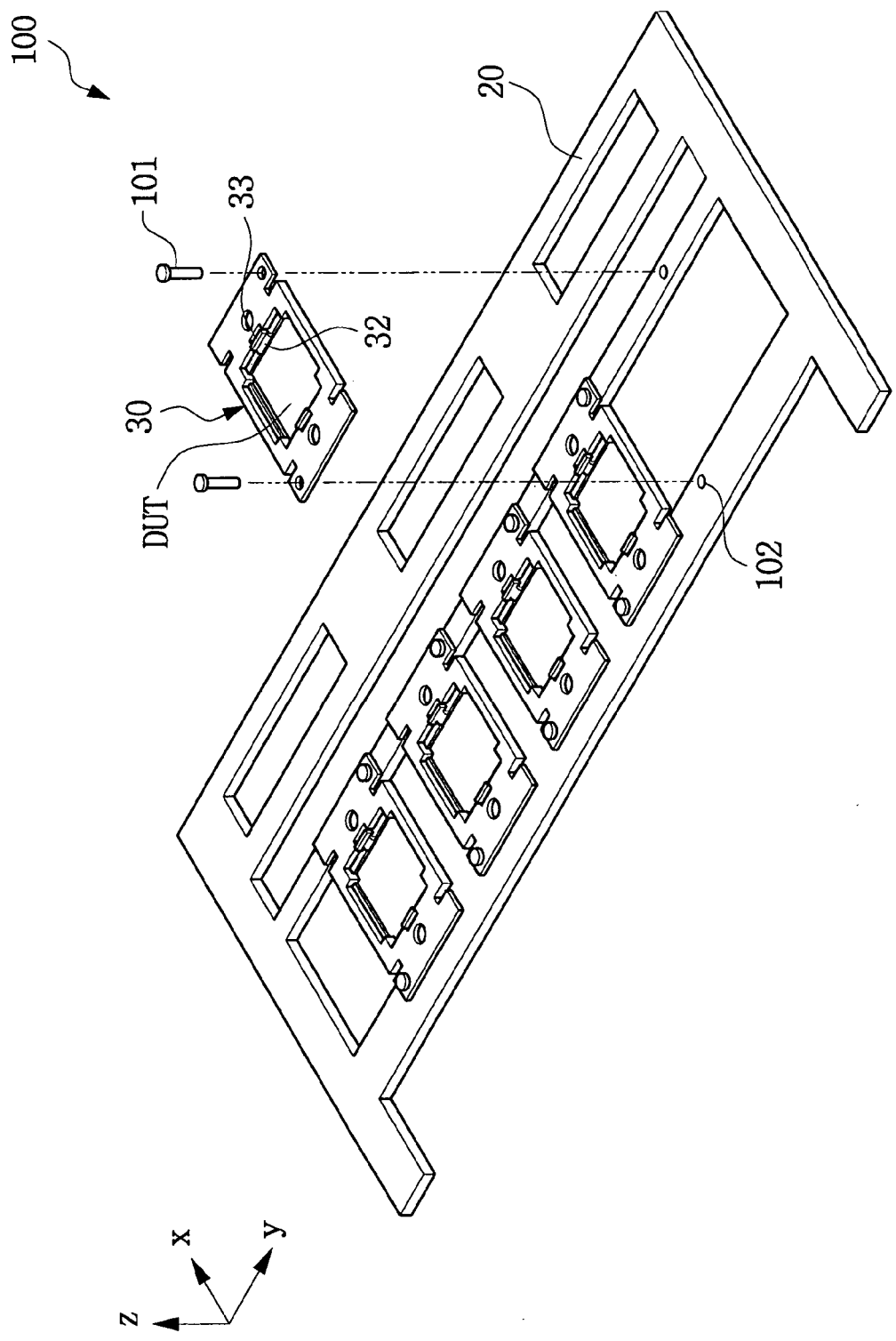
FIG. 1 is a perspective view showing an insert tray of a conventional horizontal handler.
Figure 2:
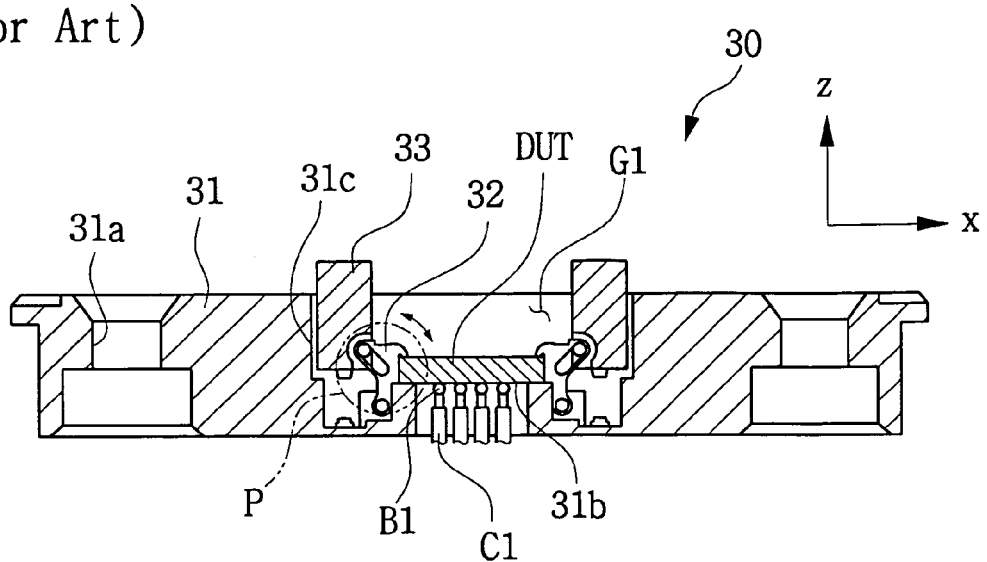
FIG. 2 is a sectional view showing the conventional insert block, taken along the x-z plane in FIG. 1, for testing semiconductor packages.
Figure 3:
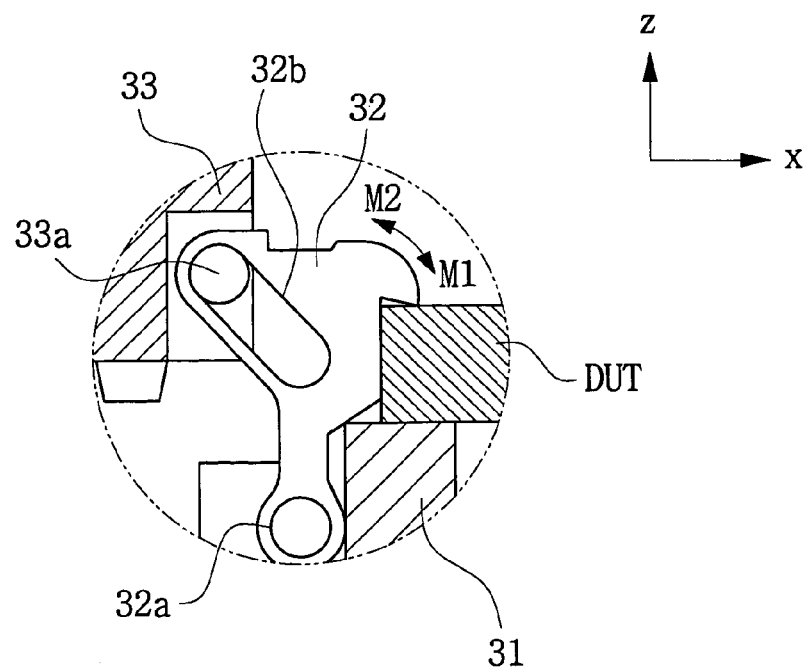
FIG. 3 is a view showing in detail the P portion of FIG. 2.
Figure 4:
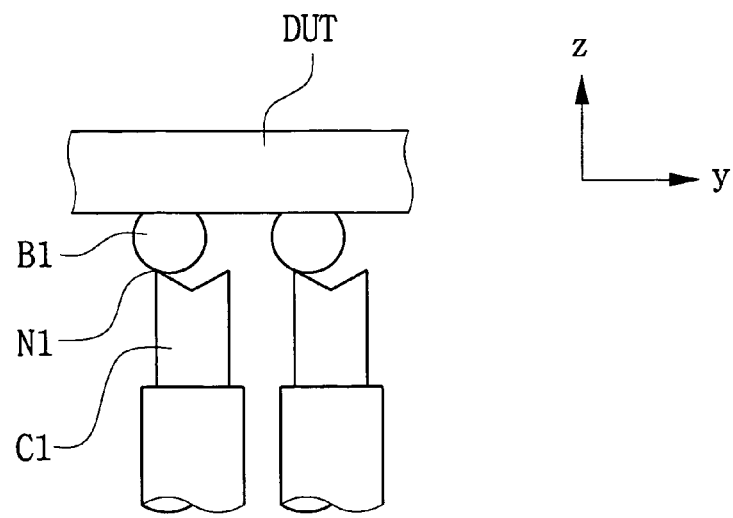
FIG. 4 is a cross-sectional view, taken along the y-z plane, showing the DUT loaded in the conventional insert block contacts with the contact pins of the test socket.

The latch 132, as shown in FIG. 6, turns in the M3 or M4 direction with its rotating shaft 132a as the axis of rotation. Turning in the M3 direction, the latch 132 applies force to the top surface of the DUT. The latch 132 can apply force to the side of the DUT in addition to the top surface thereof, like the conventional latch 32 indicated in FIG. 2. A sliding groove 132b is formed in the latch 132, and a hanging bar 133a of the latch cap 133 is inserted therein.

The latch cap 133 moves up and down in the direction of the z-axis along a cap guide 131c shown in FIG. 6. The latch cap 133 includes the cylindrical-shaped hanging bar 133a, which penetrate the sliding groove 132b of the latch 132. Consequently, the up and down movement of the latch cap 133 causes the latch 132 to rotate in the M3 or M4 direction via the cam-like behavior of the hanging bar 133a and sliding groove 132b. Since the latch 132 applies force to the top surface of the DUT downward along the z-axis, the DUT comes to be fixed relative to the z-axis. Latch cap springs E1 installed in the block body 131 apply force to the latch cap 133 upward along the z-axis.

A weight plate 134 to press down the latch cap 133 and weight plate springs E2, omitted for illustration convenience in FIG. 5 and displayed with dot-dash lines in FIG. 6, may be added on the insert block.

Figure 7:
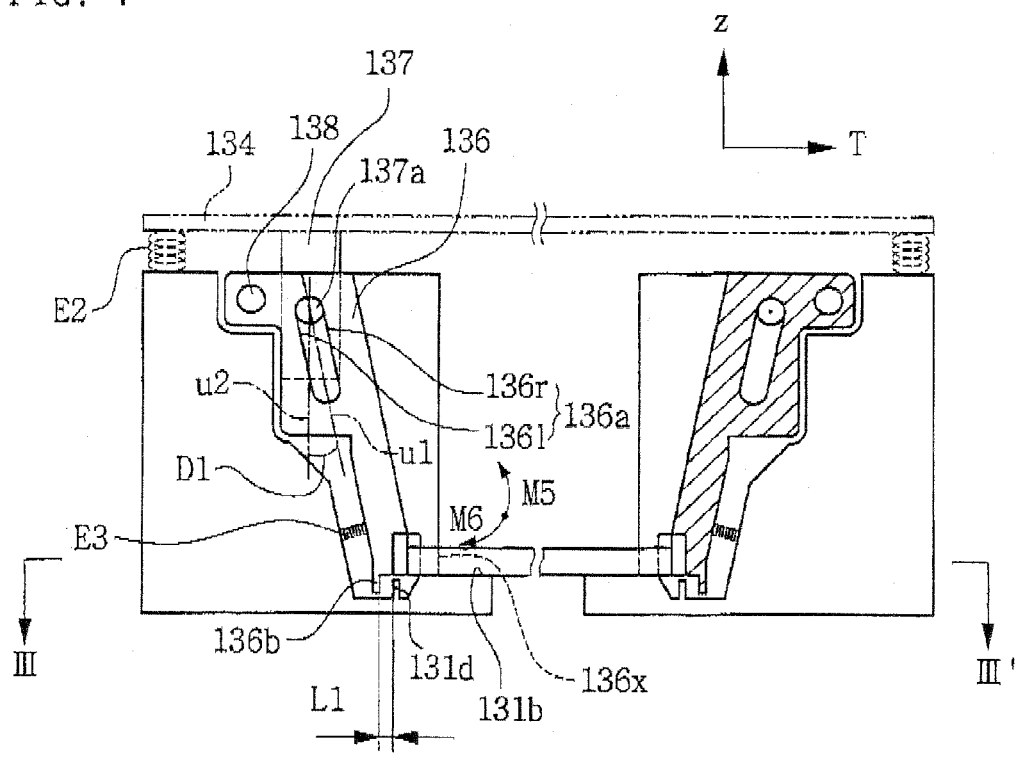
FIG. 7 is a sectional view taken along line II–II' in FIG. 5.
Figure 8:
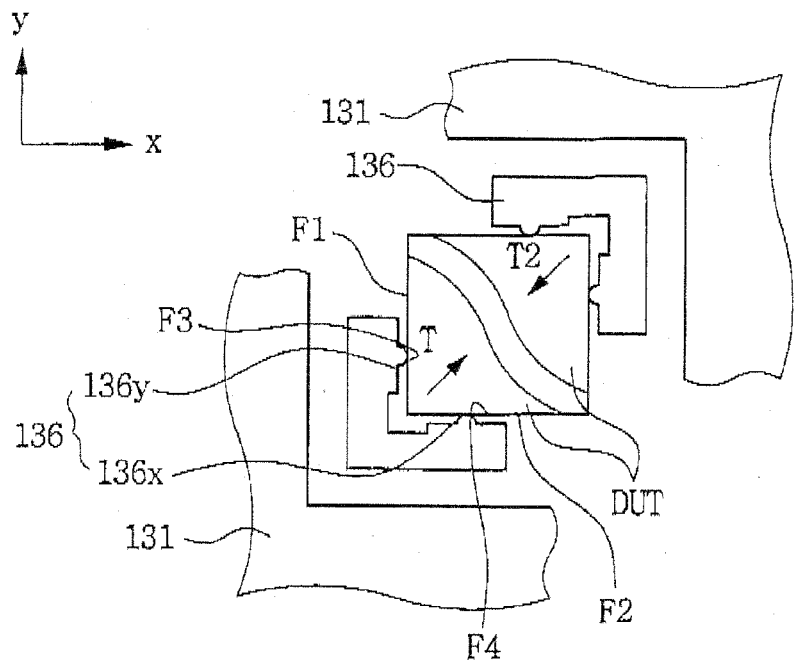
FIG. 8 is a sectional view taken along line III–III' in FIG. 7.
Figure 10:
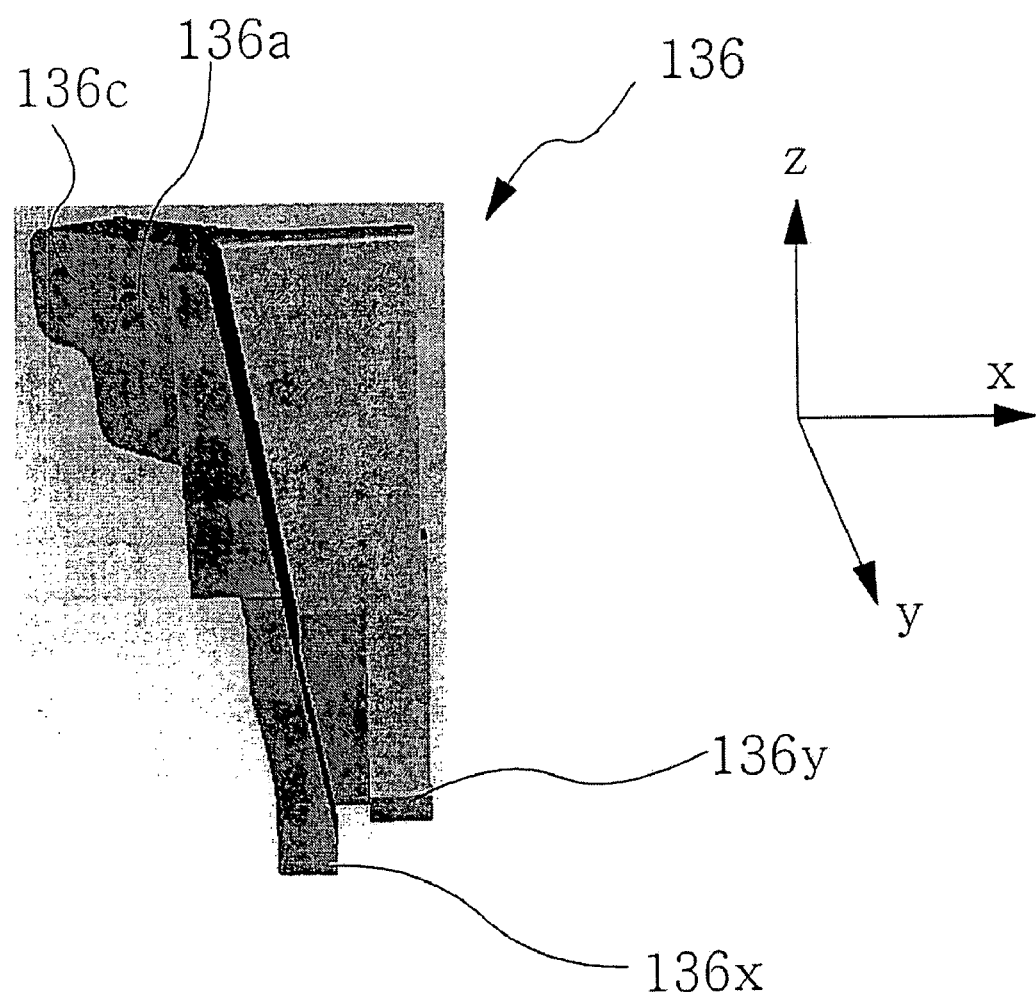
FIG. 10 is a perspective view showing a pusher of the insert block for testing semiconductor packages according to the invention.

FIG. 7 is a cross-sectional view showing the insert block taken along the T-direction, line II–II', in FIG. 5, and FIG. 8 is a sectional view taken along the line III–III' in FIG. 7. FIG. 10 is a perspective view showing a pusher of the insert block for testing semiconductor packages according to the invention.

As shown in FIGS. 5, 7 and 8, the insert block 130 further includes a pusher 136 and a reciprocating body 137.

The pusher 136, shown in FIGS. 8 and 10, includes two push rods 136x, 136y. The first push rod 136x applies force to a first adjacent side F1 of the DUT, and the second push rod 136y applies force to a second adjacent side F2 of the DUT. Here, the first push rod 136x pushes the DUT in the x-axis direction and the second push rod 136y pushes the DUT in the y-axis direction. Consequently, the DUT can be centered in the insert block 130, because one pusher 136 pushes the DUT in the T-direction between the x and y axes and another pusher 136 at the opposite corner of the DUT pushes the DUT in the T2-direction.

As shown in FIG. 8, it is possible to center the DUT by using two pushers located near opposite corners of a diagonal of the DUT. However, it is desirable to install four pushers 136 in the block body 131 in order to firmly center the DUT.

In FIG. 8, the contact surface F4 of the first push rod 136x contacting with the corresponding side of the DUT is perpendicular to the contact surface F3 of the second push rod 136y. However, hemispheric protrusions (not shown) can be formed on the push rods 136x, 136y. Because these hemispheric protrusions can make point contact with the DUT, it can be effective for them to center DUTs that have non-uniform sides or non-perpendicular adjacent side surfaces.

The pusher 136, shown in FIG. 7, is a rotary pusher rotating around the center of an axial shaft 138. The pusher 136 includes a linear sliding groove 136a. While the sliding groove 136a is linear in this embodiment, it can take curved, bent, or other shapes as long as it allows the pusher 136 to rotate in the M5 or M6 direction through the cam-like behavior along with the reciprocating body 137.

As shown in FIG. 7, the pusher 136 may have a pusher protrusion 136b. The pusher protrusion 136b contacts with a stopper 131d installed in the block body 131 when the pusher 136 rotates in the M5 direction. Namely, the stopper 131d limits the degree of rotation of the pusher 136. When the pusher 136 contacts with a DUT which meets designed values, considering that the tolerance with respect to the x-axis is in the range of about 0.1 to about 0.2 mm, it is preferable to set the distance between the pusher protrusion 136b and the stopper 131d to be within the range of about 0.05 to about 0.1 mm.

In addition, as shown in FIG. 7, a pusher spring E3 pushing the pusher 136 in the T-direction can be installed between the block body 131 and the pusher 136. The elastic force of this pusher spring E3 increases the pusher's force on the DUT.

The reciprocating body 137, as shown in FIG. 7, moves up and down along the z-axis and has a cylindrical hanging protrusion 137a inserted into the sliding groove 136a. The reciprocating body 137, like the latch cap (133 in FIG. 6), receives upward pushing force from a reciprocating body spring (E4 in FIG. 9). A designated angle D1 is maintained between the direction u2 of the movement of the reciprocating body 137 and the direction u1 extended from the sliding groove 136a. In other words, the angle D1, between the direction u2 of the movement of the reciprocating body 137 and the direction u1 extended from the sliding groove 136a, varies corresponding to the height of the reciprocating body 137 within the range greater than 0° and less than 90°. Namely, the direction u1 extended from the sliding groove 136a makes the angle range of about 0 to about 90° counterclockwise with respect to the direction u2 of the movement of the reciprocating body 137. The downward movement of the reciprocating body 137 causes the hanging protrusion 137a to push the left side 136l of the sliding groove 136a, and the pusher to rotate in the M6 direction and thereby the pusher to be detached from the DUT. Conversely, the upward movement of the reciprocating body 137 causes the hanging protrusion 137a to push the right side 136r of the sliding groove 136a, and the pusher 136 to rotate in the M5 direction and thereby the pusher to apply force to the two sides of the DUT. Hence the centering of the DUT is accomplished.

When the first contact surface F3 of the first push rod 136x contacting with the corresponding side of the DUT is perpendicular to the second contact surface F4 of the second push rod 136y as shown in FIG. 8, it is preferable to maintain the angle between the direction extended from the intersecting line made by the extended surfaces from the first and second contact surfaces F3 and F4 and the direction extended from the sliding groove (136a in FIG. 7) to be in the range of about 3 to about 45°. For instance, in the case that the direction extended from the intersecting line made by the extended surfaces from the first and second contact surfaces F3 and F4 runs parallel with the u2 direction in FIG. 7, when the angle D1 between the direction u2 of the movement of the reciprocating body 137 and the direction u1 extended from the sliding groove 136a is maintained in the range of about 3 to about 45°, effective cam-like behavior of the hanging protrusion 137a of the reciprocating body 137 and the sliding groove 136a of the pusher 136 can be performed.

As explained before, a weight plate 134 to press down the reciprocating body 137 and weight plate springs E2, displayed with dot-dash lines in FIG. 7, may be added on the insert block. The weight plate 134 contacts both with the upper ends of the reciprocating body 137 and the latch cap (133 in FIG. 6). The downward movement of the weight plate 134 leads to the downward movement of both the reciprocating body 137 and the latch cap (133 in FIG. 6) along the z-axis. Consequently, as shown in FIG. 7 the downward movement of the weight plate 134 causes the reciprocating body 137 to move downward and hence the pusher 136 to rotate in the M6 direction, thereby the pusher 136 becomes detached from the DUT. As shown in FIG. 6 the downward movement of the weight plate 134 causes also the latch cap 133 to move downward and hence the latch 132 to rotate in the M4 direction, thereby the latch 132 becomes detached from the DUT.

The weight plate spring E2, in FIGS. 6 and 7, pushes away the weight plate 134 from the block body 131.

Figure 9:
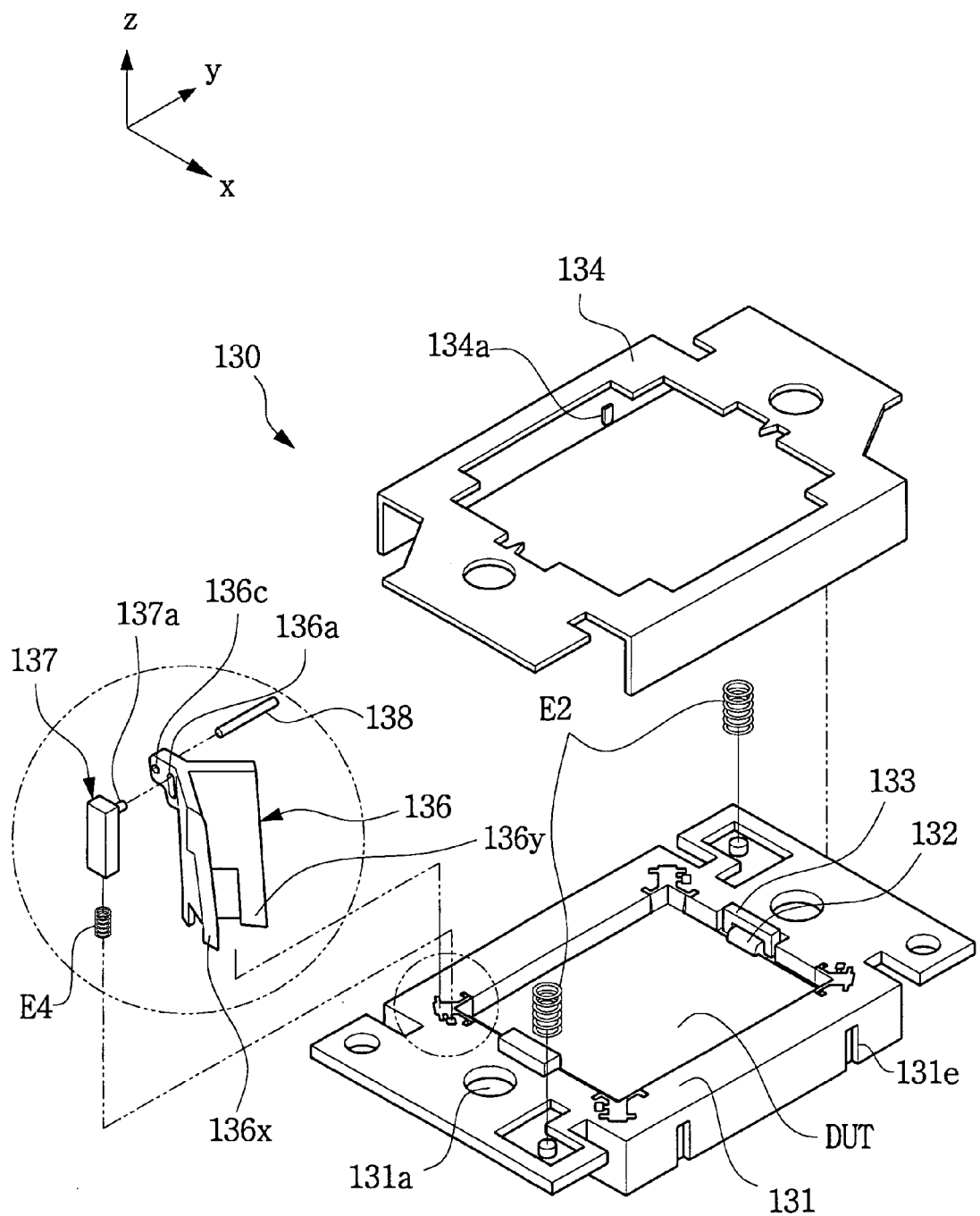
FIG. 9 is an exploded perspective view showing an insert block for testing semiconductor packages according to the invention.

FIG. 9 is an exploded perspective view showing an insert block for testing semiconductor devices according to the invention.

As shown in FIG. 9, the latch 132, the pusher 136, the reciprocating body 137, the reciprocating body spring E4, the weight plate 134, and the weight plate spring E2 are installed in the block body 131 loaded with the DUT.

The latch 132 applies force to the DUT downward along the z-axis by its rotational motion linked with the up and down movement of the latch cap 133. For illustration convenience, in FIG. 9 the latch 132 and latch cap 133 are displayed as already installed in the block body 131.

The pusher 136 includes a shaft hole 136c into which the axial shaft 138 is inserted, the sliding groove 136a into which the hanging protrusion 137a of the reciprocating body 137 is inserted, the first push rod 136x to push the DUT along the x-axis, and the second push rod 136y to push the DUT along the y-axis.

The reciprocating body 137 includes a cylindrical hanging protrusion 137a to be inserted into the sliding groove 136a of the pusher 136.

The reciprocating body spring E4 installed under the reciprocating body 137 pushes the reciprocating body 137 upward along the z-axis from the block body 131.

The weight plate 134 is placed on the block body 131 with a designated gap therebetween, in a state where a weight plate hook 134a of the weight plate 134 is hooked with a hook slot 131e of the block body 131. The weight plate 134 is movable up and down along the z-axis on the block body 131.

The weight plate spring E2 is located between the weight plate 134 and the block body 131 and separates the weight plate 134 from the block body 131.

As explained above, firm centering of semiconductor devices under test relative to the contact pins of the test socket along the two perpendicular axes (for instance, x and y axes) on the top or bottom surface of the semiconductor device is achieved and leads to the proper interfaces between the external terminals of the semiconductor device under test and the contact pins of the test socket, and thereby improves the quality of connection therebetween.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

What is claimed is:

1. An insert block for testing semiconductor devices, comprising:
    a block body having a loading space structured to accommodate a semiconductor device under test;
    one or more pushers installed in the block body adapted to apply force to the semiconductor device under test, wherein the pusher includes a first push rod adapted to apply force to one of adjacent sides of the semiconductor device under test, and a second push rod adapted to apply force to the other thereof, and the pushers are rotary pushers rotating around an axial shaft installed in the block body as the center of rotation;
    a sliding groove formed on each rotary pusher; and
    a reciprocating body having a hanging protrusion which is inserted into the sliding groove so as to reciprocate therein.

2. The insert block of claim 1, wherein a first contact surface of the first push rod contacting with the corresponding side of the semiconductor device under test is substantially perpendicular to a second contact surface of the second push rod.

3. The insert block of claim 1, wherein the first and second push rods have hemispheric protrusions, wherein the hemispheric protrusions make point contact with the semiconductor device under test.

4. The insert block of claim 1, wherein the block body comprises a stopper to contact with the rotary pusher so as to limit the degree of rotation of the rotary pusher.

5. The insert block of claim 1, wherein the rotary pushers are first and second rotary pushers; and the first and second rotary pushers apply forces to the diagonally opposite corners selected from the four corners of the semiconductor device under test.

6. The insert block of claim 1, further comprising a pusher spring installed between the block body and the pusher so as to push the pusher toward the semiconductor device under test.

7. The insert block of claim 1, wherein the rotary pushers are first and second rotary pushers; and the first and second rotary pushers apply forces to the diagonally opposite corners selected from the four corners of the semiconductor device under test.

8. The insert block of claim 1, further comprising:
    a weight plate installed on the block body and contacting with the reciprocating body; and
    a weight plate spring placed between the weight plate and the block body so as to separate the weight plate from the block body.

9. The insert block of claim 1, further comprising a reciprocating body spring installed between the reciprocating body and the block body, wherein the reciprocating body spring pushes away the reciprocating body from the block body.

10. The insert block of claim 9, wherein the rotary pushers are a first and a second rotary pushers; and the first and second rotary pushers apply forces to the diagonally opposite corners selected from the four corners of the semiconductor device under test.

11. The insert block of claim 9, further comprising:
    a weight plate installed on the block body and contacting with the reciprocating body; and
    a weight plate spring placed between the weight plate and the block body so as to separate the weight plate from the block body.

12. The insert block of claim 1, wherein the sliding groove is linear; and the direction of movement of the reciprocating body makes a designated angle with the direction extended from the linear sliding groove.

13. The insert block of claim 12, wherein the first contact surface of the first push rod contacting with the semiconductor device under test is perpendicular to the second contact surface of the second push rod; and the angle between the direction extended from the intersecting line made by the extended surfaces from the first and second contact surfaces and the direction extended from the sliding groove is in the range of about 3 to about 45°.

14. A method of manufacturing an insert block for testing semiconductor devices, comprising:
    providing a block body having a loading space to accommodate a semiconductor under test;
    installing one or more pushers in the block body so as to apply force to the semiconductor device under test, wherein the pusher includes a first push rod to apply force to one of adjacent sides of the semiconductor device under test, and a second push rod to apply force to the other thereof and the pushers are rotary pushers rotating around an axial shaft installed in the block body as the center of rotation;
    forming a sliding groove on each rotary pushers; and
    inserting a reciprocating body having a hanging protrusion into the sliding groove so as to reciprocate therein.

15. The method of claim 14, further comprising:
    installing a weight plate on the block body, the weight plate contacting the reciprocating body; and
    placing a weight plate spring between the weight plate and the block body so as to separate the weight plate from the block body.

* * * * *

UNITED STATES PATENT AND TRADEMARK OFFICE
CERTIFICATE OF CORRECTION

| | | |
|---|---|---|
| PATENT NO. | : 7,151,368 B2 | Page 1 of 1 |
| APPLICATION NO. | : 11/243458 | |
| DATED | : December 19, 2006 | |
| INVENTOR(S) | : Hyeck-Jin Joung et al. | |

It is certified that error appears in the above-identified patent and that said Letters Patent is hereby corrected as shown below:

Title page; Col. 2, under Foreign Patent Documents, KR 11-287842 10/1999, the word "KR" should read -- JP --.

Signed and Sealed this

Thirtieth Day of September, 2008

JON W. DUDAS
*Director of the United States Patent and Trademark Office*